(12) United States Patent
Sharon et al.

(10) Patent No.: US 12,293,796 B2
(45) Date of Patent: May 6, 2025

(54) STORAGE SYSTEM AND METHOD FOR IMPLEMENTATION OF SYMMETRIC TREE MODELS FOR READ THRESHOLD CALIBRATION

(71) Applicant: Western Digital Technologies, Inc., San Jose, CA (US)

(72) Inventors: Eran Sharon, Rishon Lezion (IL); Ariel Navon, Revava (IL); Alexander Bazarsky, Holon (IL); David Avraham, San Jose, CA (US); Nika Yanuka, Hadera (IL); Idan Alrod, Herzeliya (IL)

(73) Assignee: Sandisk Technologies, Inc., Milpitas, CA (US)

( * ) Notice: Subject to any disclaimer, the term of this patent is extended or adjusted under 35 U.S.C. 154(b) by 456 days.

(21) Appl. No.: 17/899,073

(22) Filed: Aug. 30, 2022

(65) Prior Publication Data

US 2023/0410869 A1    Dec. 21, 2023

Related U.S. Application Data

(63) Continuation-in-part of application No. 17/838,481, filed on Jun. 13, 2022, now Pat. No. 12,283,328.

(51) Int. Cl.
*G11C 11/00* (2006.01)
*G11C 11/16* (2006.01)
(Continued)

(52) U.S. Cl.
CPC ...... *G11C 16/3459* (2013.01); *G11C 11/1673* (2013.01); *G11C 16/08* (2013.01);
(Continued)

(58) Field of Classification Search
CPC . G11C 16/3459; G11C 11/1673; G11C 16/08; G11C 16/102; G11C 16/14;
(Continued)

(56) References Cited

U.S. PATENT DOCUMENTS 7,876,671 B2    1/2011  Pimlott
7,995,387 B2    8/2011  Sharon et al.
(Continued)

OTHER PUBLICATIONS

U.S. Appl. No. 17/838,481, filed Jun. 13, 2022, entitled "Storage System and Method for Inference of Read Thresholds Based on Memory Parameters and Conditions."
(Continued)

*Primary Examiner* — Hien N Nguyen
(74) *Attorney, Agent, or Firm* — Crowell & Moring LLP

(57) ABSTRACT

A storage system has an inference engine that can infer a read threshold based on a plurality of parameters of the memory. The read threshold can be used in reading a wordline in the memory during a regular read operation or as part of an error handling process. Using this machine-learning-based approach to infer a read threshold can provide significant improvement in read threshold accuracy, which can reduce bit error rate and improve latency, throughput, power consumption, and quality of service. In another embodiment, a storage system is configured to use a binary full-depth symmetrically-sorted tree to infer a read threshold based on a plurality of parameters of the memory.

20 Claims, 19 Drawing Sheets

(51) Int. Cl.
| | |
|---|---|
| *G11C 16/08* | (2006.01) |
| *G11C 16/10* | (2006.01) |
| *G11C 16/14* | (2006.01) |
| *G11C 16/26* | (2006.01) |
| *G11C 16/34* | (2006.01) |
| *G11C 29/52* | (2006.01) |
| *G11C 16/04* | (2006.01) |

(52) U.S. Cl.
CPC ............ *G11C 16/102* (2013.01); *G11C 16/14* (2013.01); *G11C 16/26* (2013.01); *G11C 16/3495* (2013.01); *G11C 29/52* (2013.01); *G11C 16/0483* (2013.01)

(58) Field of Classification Search
CPC ..... G11C 16/26; G11C 16/3495; G11C 29/52; G11C 16/0483; G11C 29/021; G11C 11/5642; G11C 29/028
See application file for complete search history.

(56) References Cited

U.S. PATENT DOCUMENTS

| | | | |
|---|---|---|---|
| 8,374,026 | B2 | 2/2013 | Sharon et al. |
| 8,782,495 | B2 | 7/2014 | Alrod et al. |
| 9,070,479 | B2 | 6/2015 | Sharon et al. |
| 9,141,475 | B2 | 9/2015 | Alrod et al. |
| 9,431,120 | B1 * | 8/2016 | Tuers .................. G11C 11/5628 |
| 9,697,905 | B2 | 7/2017 | Sharon et al. |
| 9,728,263 | B2 | 8/2017 | Sharon |
| 9,996,281 | B2 | 6/2018 | Sharon et al. |
| 10,379,739 | B1 | 8/2019 | Bazarsky et al. |
| 10,418,097 | B2 | 9/2019 | Avraham et al. |
| 10,475,523 | B2 | 11/2019 | Sharon et al. |
| 10,811,091 | B2 | 10/2020 | Bazarsky et al. |
| 10,991,444 | B1 | 4/2021 | Bazarsky et al. |
| 11,081,474 | B1 | 8/2021 | Hoang et al. |
| 11,150,825 | B2 | 10/2021 | Kashyap et al. |
| 11,244,732 | B2 | 2/2022 | Sharon et al. |
| 2012/0063227 | A1 | 3/2012 | Weingarten et al. |
| 2014/0056066 | A1 | 2/2014 | Baum et al. |
| 2017/0139590 | A1 | 5/2017 | Hsu et al. |
| 2017/0162268 | A1 | 6/2017 | Chen et al. |
| 2019/0189236 | A1 | 6/2019 | Poliakov et al. |
| 2020/0364108 | A1 | 11/2020 | Froelich et al. |
| 2021/0241845 | A1 * | 8/2021 | Li ........................... G11C 11/54 |
| 2021/0334035 | A1 | 10/2021 | Sheperek et al. |
| 2022/0027721 | A1 | 1/2022 | Zhang et al. |
| 2022/0075561 | A1 | 3/2022 | Peltz et al. |
| 2022/0121387 | A1 | 4/2022 | Ha et al. |
| 2022/0121985 | A1 | 4/2022 | Lloyd et al. |
| 2022/0254419 | A1 | 8/2022 | Kim et al. |

OTHER PUBLICATIONS

U.S. Appl. No. 18/220,363, filed Jul. 11, 2023, entitled "Storage System and Method for Circuit-Bounded-Array-Based Time and Temperature Tag Management and Inference of Read Thresholds."

U.S. Appl. No. 18/239,302, filed Aug. 29, 2023, entitled "Data Storage Device and Method for Inferring a Read Threshold Using a Time Tag Determination."

U.S. Appl. No. 18/242,061, filed Sep. 5, 2023, entitled "Data Storage Device and Method for Predicting Future Read Thresholds."

U.S. Appl. No. 18/777,942, filed Jul. 19, 2024, entitled "Data Storage Device and Method for Using Multiple Models for Predicting a Read Threshold."

U.S. Appl. No. 18/800,681, filed Aug. 12, 2024, entitled "Data Storage Device and Method for Combining Prediction Models for Read Threshold Calibration."

U.S. Appl. No. 18/664,514, filed May 15, 2024, entitled "Data Storage Device and Method for Generating Read Threshold Voltages."

U.S. Appl. No. 18/658,074, filed May 8, 2024, entitled "Data Storage Device and Method for Predictive Read Threshold Calibration."

U.S. Appl. No. 18/772,563, filed Jul. 15, 2024, entitled "Data Storage Device and Method for Using Modular Models for Inferring a Read Threshold."

* cited by examiner

STORAGE SYSTEM AND METHOD FOR IMPLEMENTATION OF SYMMETRIC TREE MODELS FOR READ THRESHOLD CALIBRATION

CROSS-REFERENCE TO RELATED APPLICATION

This application is a continuation-in-part of U.S. patent application Ser. No. 17/838,481, filed Jun. 13, 2022, which is hereby incorporated by reference.

BACKGROUND

One of the main challenges introduced by NAND process shrinking and three-dimensional stacking is maintaining process uniformity. In addition, memory products need to support a wide range of operational conditions, such as different program/erase cycles, retention times, and temperatures, which leads to increased variability between memory dies, blocks, and pages across the different operational conditions. Due to these variations, the read thresholds used for reading a memory page are not fixed and change significantly as a function of the physical location and the operational conditions, especially for less-mature, new memory nodes. Reading with inaccurate read thresholds can lead to higher bit error rates, which can degrade performance and quality of service due to decoding failures, which require invoking high-latency recovery flows, causing delays and hiccups in performance.

DETAILED DESCRIPTION

The following embodiments generally relate to a storage system and method for inference of optimal read thresholds based on memory parameters and conditions. In one embodiment, a storage system is provided comprising a memory and a controller. The controller is configured to use an inference engine to infer a read threshold based on a plurality of parameters of the memory and use the read threshold in reading a wordline in the memory. In another embodiment, a method is provided that is performed in a storage system comprising a memory. The method comprises generating an inference of a read threshold based on a plurality of parameters of the memory and using the read threshold in reading a wordline in the memory. In yet another embodiment, a storage system is provided comprising a memory, an inference engine configured to provide an inference of a read threshold based on a plurality of parameters of the memory, and means for re-training the inference engine based on a quality of the inference.

Other embodiments relate to a storage system and method for implementation of symmetric tree models for read threshold calibration. In one embodiment, a storage system is provided comprising a memory and a controller. The controller is configured to use a binary full-depth symmetrically-sorted tree to infer a read threshold based on a plurality of parameters of the memory; and use the read threshold to read a wordline in the memory. In another embodiment, a method is provided that is performed in a storage system comprising a memory. The method comprises using a binary full-depth symmetrically-sorted tree to infer a read threshold based on a plurality of parameters of the memory; and using the read threshold to read a wordline in the memory. In yet another embodiment, a storage system is provided comprising a memory and means for using a binary full-depth symmetrically-sorted tree to infer a read threshold based on a plurality of parameters of the memory. Other embodiments are provided and can be used alone or in combination.

Figure 1A:
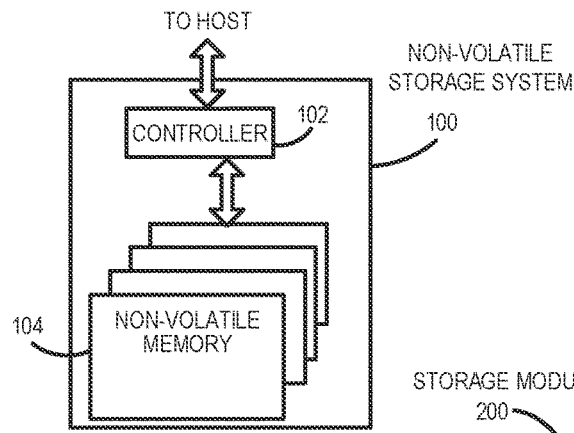
FIG. 1A is a block diagram of a non-volatile storage system of an embodiment.
Figure 1B:
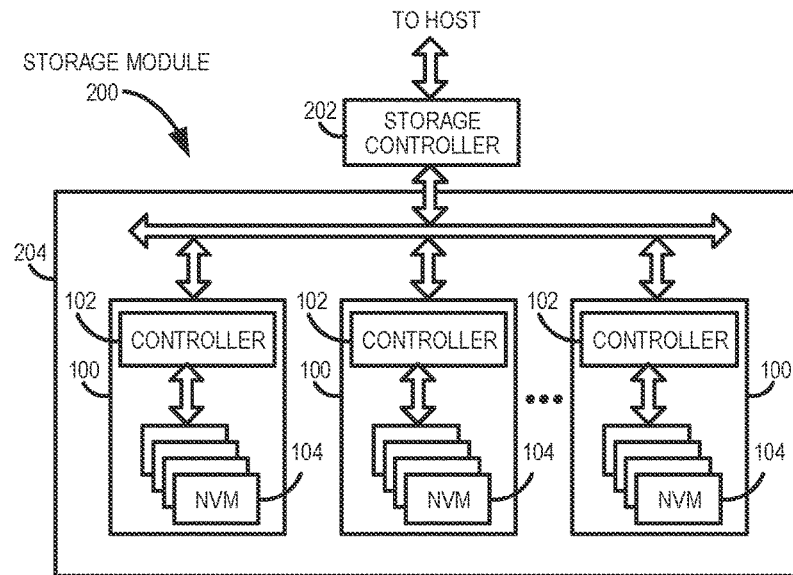
FIG. 1B is a block diagram illustrating a storage module of an embodiment.
Figure 1C:
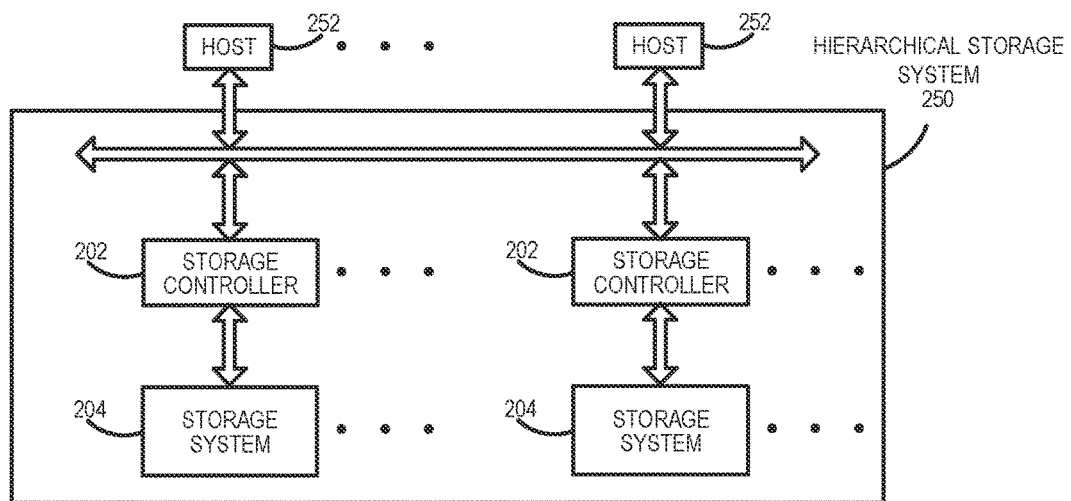
FIG. 1C is a block diagram illustrating a hierarchical storage system of an embodiment.

Turning now to the drawings, storage systems suitable for use in implementing aspects of these embodiments are shown in FIGS. 1A-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magneto-resistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory cells that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including ReRAM, MRAM, PCM, NAND flash memory cells and/or NOR flash memory cells. The memory cells can take the form of solid-state (e.g., flash) memory cells and can be one-time programmable, few-time programmable, or many-time programmable. The memory cells can also be single-level (one-bit per cell) cells (SLC) or multiple-level cells (MLC), such as two-level cells, triple-level cells (TLC), quad-level cell (QLC) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card-based system, such as a secure digital (SD) or a micro secure digital (micro-SD) card (or USB, SSD, etc.). In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid-state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
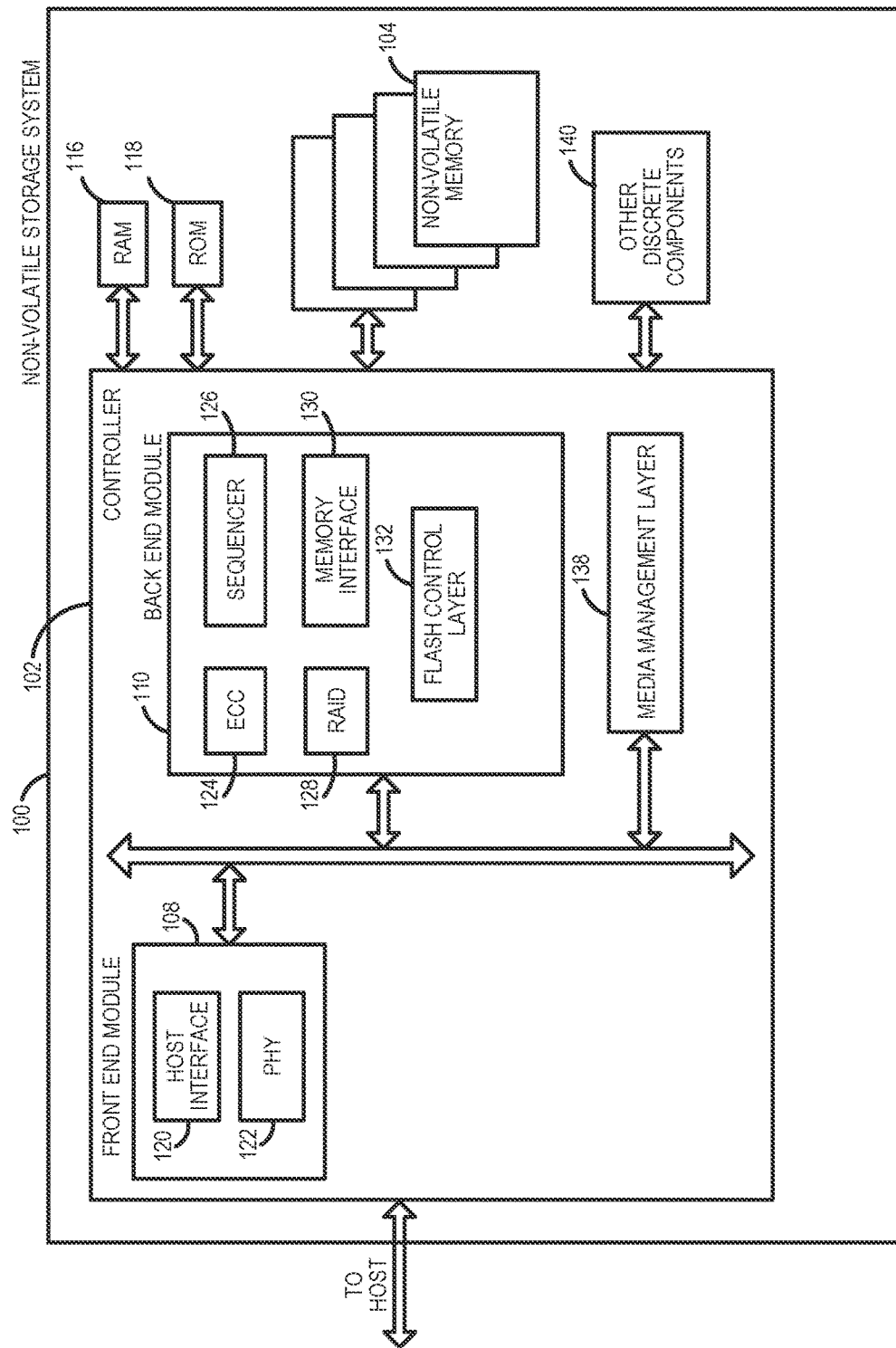
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
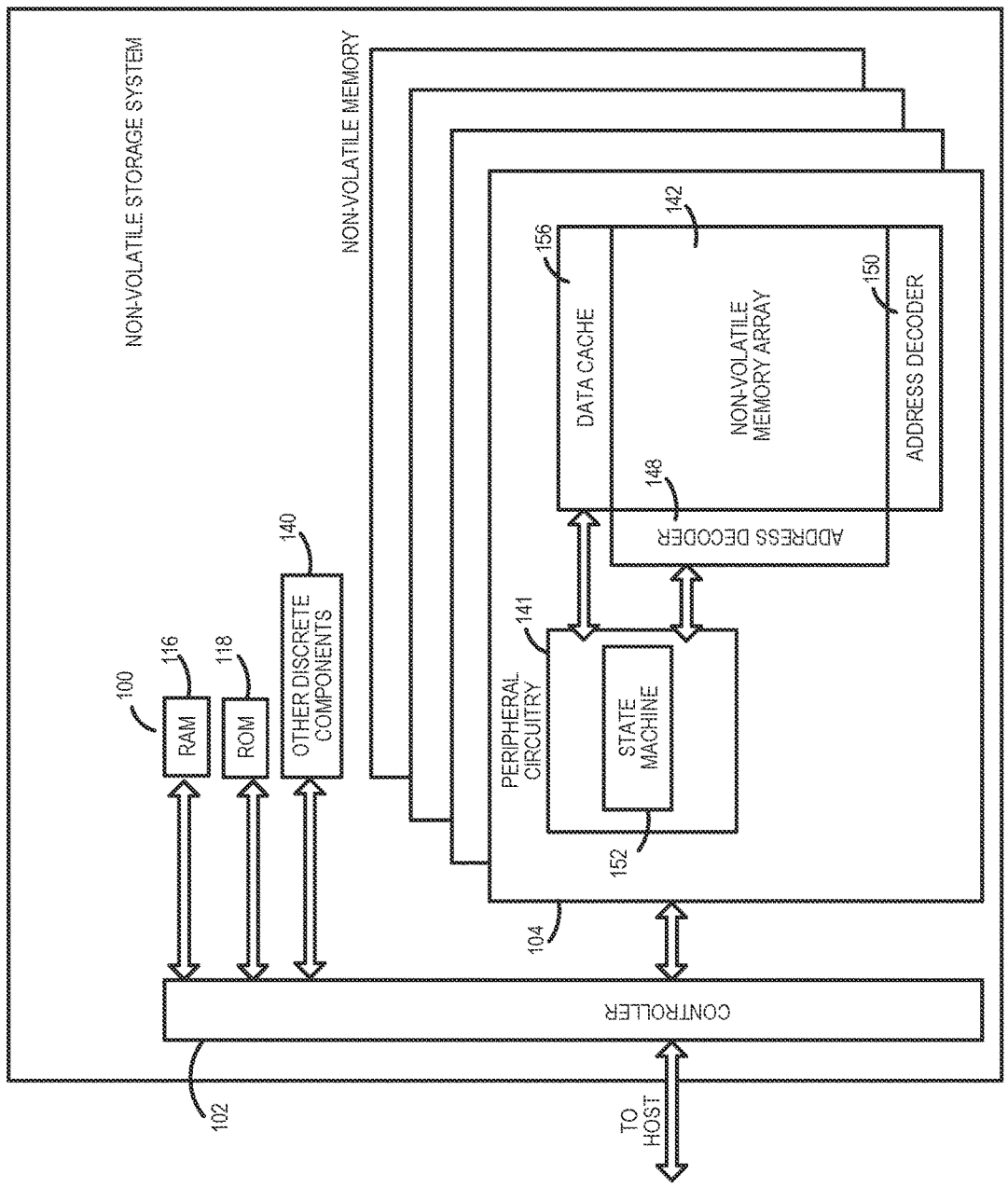
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block of memory cells. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
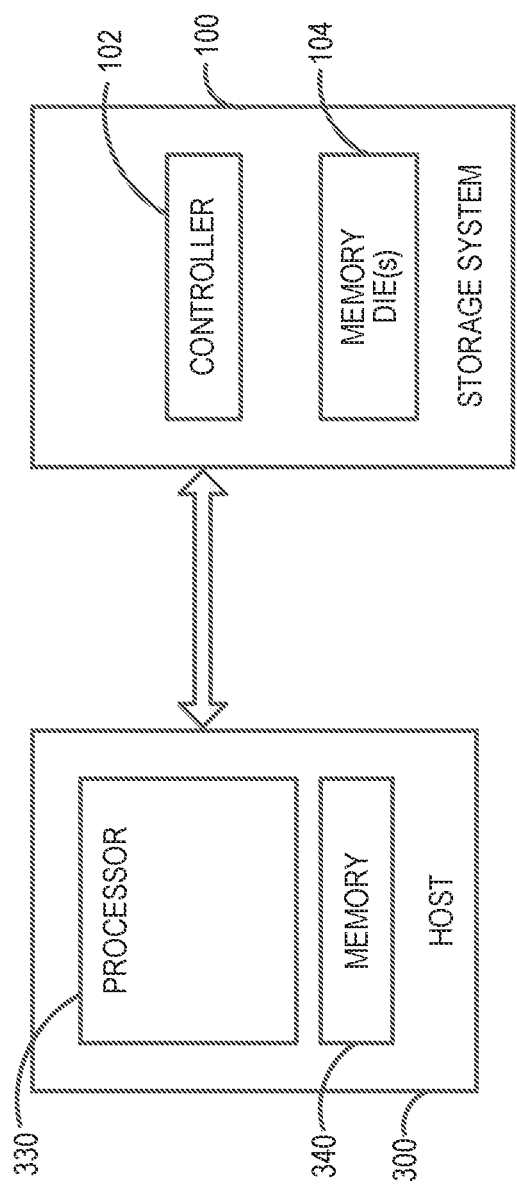
FIG. 3 is a block diagram of a host and storage system of an embodiment.

Turning again to the drawings, FIG. 3 is a block diagram of a host 300 and storage system (sometimes referred to herein as a device) 100 of an embodiment. The host 300 can take any suitable form, including, but not limited to, a computer, a mobile phone, a digital camera, a tablet, a wearable device, a digital video recorder, a surveillance system, etc. The host 300 comprises a processor 330 that is configured to send data (e.g., initially stored in the host's memory 340 (e.g., DRAM)) to the storage system 100 for storage in the storage system's memory 104 (e.g., non-volatile memory dies). While the host 300 and the storage system 100 are shown as separate boxes in FIG. 3, it should be noted that the storage system 100 can be integrated in the host 300, the storage system 100 can be removably connected to the host 300, and the storage system 100 and host 300 can communicate over a network. It should also be noted that the memory 104 can be integrated in the storage system 100 or removably connected to the storage system 100.

As mentioned above, one of the main challenges introduced by NAND process shrinking and three-dimensional stacking is maintaining process uniformity. In addition, memory products need to support a wide range of operational conditions, such as different program/erase cycles, retention times, and temperatures, which leads to increased variability between memory dies, blocks, and pages across the different operational conditions. Due to these variations, the read thresholds (RT) used for reading a memory page are not fixed and change significantly as a function of the physical location and the operational conditions, especially for less-mature, new memory nodes. Reading with inaccurate read thresholds can lead to higher bit error rates (BERs), which can degrade performance and quality of service (QoS) due to decoding failures, which require invoking high-latency recovery flows, causing delays and hiccups in performance.

The challenge of maintaining optimal read thresholds is especially important for enterprise memory systems for which the quality-of-service requirements are very strict, and for mobile, Internet of Things (IoT), and automotive memory systems for which the required range of operational conditions is wide and the frequency of condition changes (e.g. temperature) may be high. The problem is even more difficult during transitions to new, less-mature memory nodes.

Current solutions for read threshold calibration, such as bit error rate (BER) Estimation Scan (BES) and Valley Search (VS), are high-latency operations aimed at optimizing read thresholds for a specific wordline, which is good for rare read recovery flows in cases of failure to decode the data but is not that suitable for frequent operations in case of frequent read threshold changes. Hence, in order to cope with this issue, flash memory systems can implement read threshold management schemes that try to track read threshold changes in the background via a maintenance process to ensure that appropriate read thresholds are used when the host issues a read command.

One approach is to track the read thresholds per groups of blocks that share the same conditions. More specifically, blocks that are written roughly at the same time and temperature are grouped into time and temperature (TT) groups. Read thresholds are tracked for each TT group, usually acquired and validated on selected wordlines from a block within the group. When the host performs a read operation, the read thresholds associated with the TT group corresponding to the read block are used, wherein additional adaptation to the read thresholds, according to the specific read wordline, may be performed based on pre-calibrated wordline zoning tables.

Figure 4:
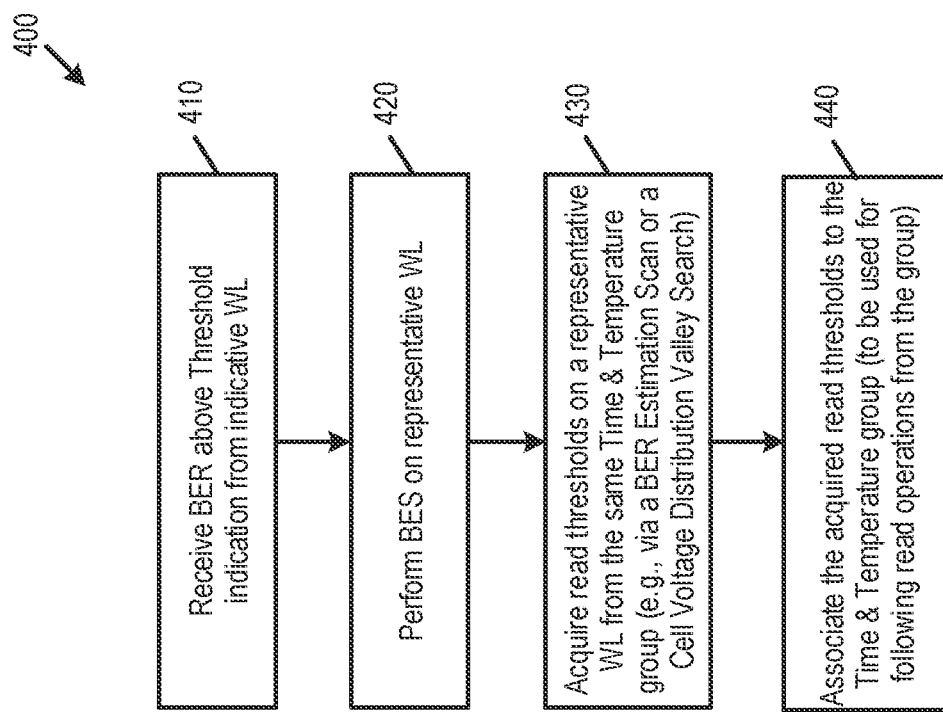
FIG. 4 is a flow chart of a read threshold calibration method of an embodiment.

Unfortunately, existing read threshold management schemes can be suboptimal and may not adequately track the read thresholds under frequently-changing conditions and high variations between memory pages. For example, as noted above, blocks can be grouped according to programming time and temperature, and a maintenance process can track the appropriate read threshold per group of blocks by finding the optimal read threshold of a representative wordline from the block (e.g., via BER Estimation Scan or Valley Search). An example of this technique is shown in the flow chart 400 of FIG. 4. As shown in FIG. 4, in this method, the storage system receives a bit error rate above a threshold indication from an indicative wordline (act 410). The storage system 100 then acquires read thresholds on a representative wordline from the same time and temperature group (e.g. via a BER Estimation Scan or a Cell Voltage Distribution Valley Search) (act 420). Next, the storage system 100 associates the acquired read thresholds to the time and temperature group (to be used for following read operations from the group) (act 430) and adjusts the read threshold based on a wordline indexing zone when reading other wordlines (act 440).

So, in this technique, predefined corrections can be applied to the read thresholds of the representative wordline based on the wordline number being read (using a wordline zoning table). In case that a certain wordline shows an elevation in bit error rate or that decoding of the wordline's data fails, a BER Estimation Scan or Valley Search can be applied in the foreground to calibrate the wordline's read threshold as part of a read error handling (REH) flow. However, this approach can be suboptimal and result in performance hiccups and quality-of-service violations under stress conditions (such as rapid temperature changes).

Other table-based methods, which set the read thresholds based on a pre-defined table as a function of various memory parameters (such as Program/Erase Count (PEC), WL #, . . . ) can be used. However, due to practical table size limitations, such methods can take into account only a limited small number of parameters or, alternatively, assume a simplistic model, wherein each factor (e.g., wordline number, program-erase count, temperature, die dependency, etc.) affects the read threshold in an independent and additive manner. In reality, the interactions may be more involved and can be more complex and non-linear.

The following embodiments can be used to infer optimal read thresholds from all available information, including TT group information, temperature information, BER information, program-erase count (PEC) information, and physical page location. In one embodiment, machine-learning methodologies are used to train a low-complexity inference model under all relevant conditions in order to learn the intricate and non-linear dependencies of the read thresholds on each of the available features. Using this approach, the storage system can fine tune the TT group read thresholds based on additional information sources, providing consistent near-optimal read thresholds. This, in turn, can reduce the BER levels of read data, which improves performance and quality of service, reduces power consumption, and reduces decoder failure events rate.

In one embodiment, the controller 102 of the storage system 100 infers an optimal read threshold based on a non-linear function of multiple inputs that reflect current memory and data conditions. Machine learning (ML) methodologies can be used to derive a read threshold inference function that makes use of all available information sources, including latest TT information of the block, BER information, temperature information (prog temp/TT acquiring temp/current read temp), PEC information, and physical location information (WL #, String #, Plane #, Edge blocks, Die X/Y info, . . . etc.). That way, improved read thresholds are used, reducing the BER levels of read data. In one implementation, the controller 102 uses a low-complexity hardware and firmware implementation of an inference function that selects appropriate engineered features and appropriate machine learning models. Of course, other implementations are possible.

As mentioned above, some methods to set the read thresholds are suboptimal and do not use all the available information sources (e.g., TT group information, NAND condition, temperature, physical address, etc.) to infer the read thresholds in an optimal and holistic manner. More specifically, the optimal read threshold for a specific page under a specific memory condition may be correlated to multiple parameters that may be available to the controller 102 during operation, such as, but not limited to: information on the time and temperature group of blocks to which the read block belongs: read thresholds acquired on representative WLx, BER information of representative WLx (SW/BER/BER1➔ 0/BER0➔ 1), temperature at which WLx read thresholds were acquired, time at which WLx read thresholds were acquired, read thresholds acquired on representative WLy, BER information of representative WLy (SW/BER/BER1➔ 0/BER0➔ 1), temperature at which WLy read thresholds were acquired, time at which WLx read thresholds were acquired, program temperature of the block being read ("Prog-Temp"), current read temperature ("Read-Temp"), the difference between Prog-Temp and current Read-Temp (also called "X-Temp"), PEC of the block being read, a data-retention level of the block being read (i.e., the TimePool index of the block, which is a function of the time that elapsed since the block was programmed, normalized by temperature), BER information of previous WLs/pages to the page being read (which may be available under sequential read scenarios), default read thresholds of the die, physical address information of the read page, WL/page #, string #, plane #, block location (e.g., edge/non-edge block), and die information (e.g., X/Y location on wafer).

Theoretically, one may use a large multi-dimensional table indexed by all these parameters, storing the optimal read levels per case; however, this is not feasible as it requires an exponentially large table. Instead, one embodiment applies machine-learning-based methodologies in order to learn a low-complexity inference model for optimal read thresholds based on all available parameters (or the most-informative and/or easily-available ones).

Figure 5A:
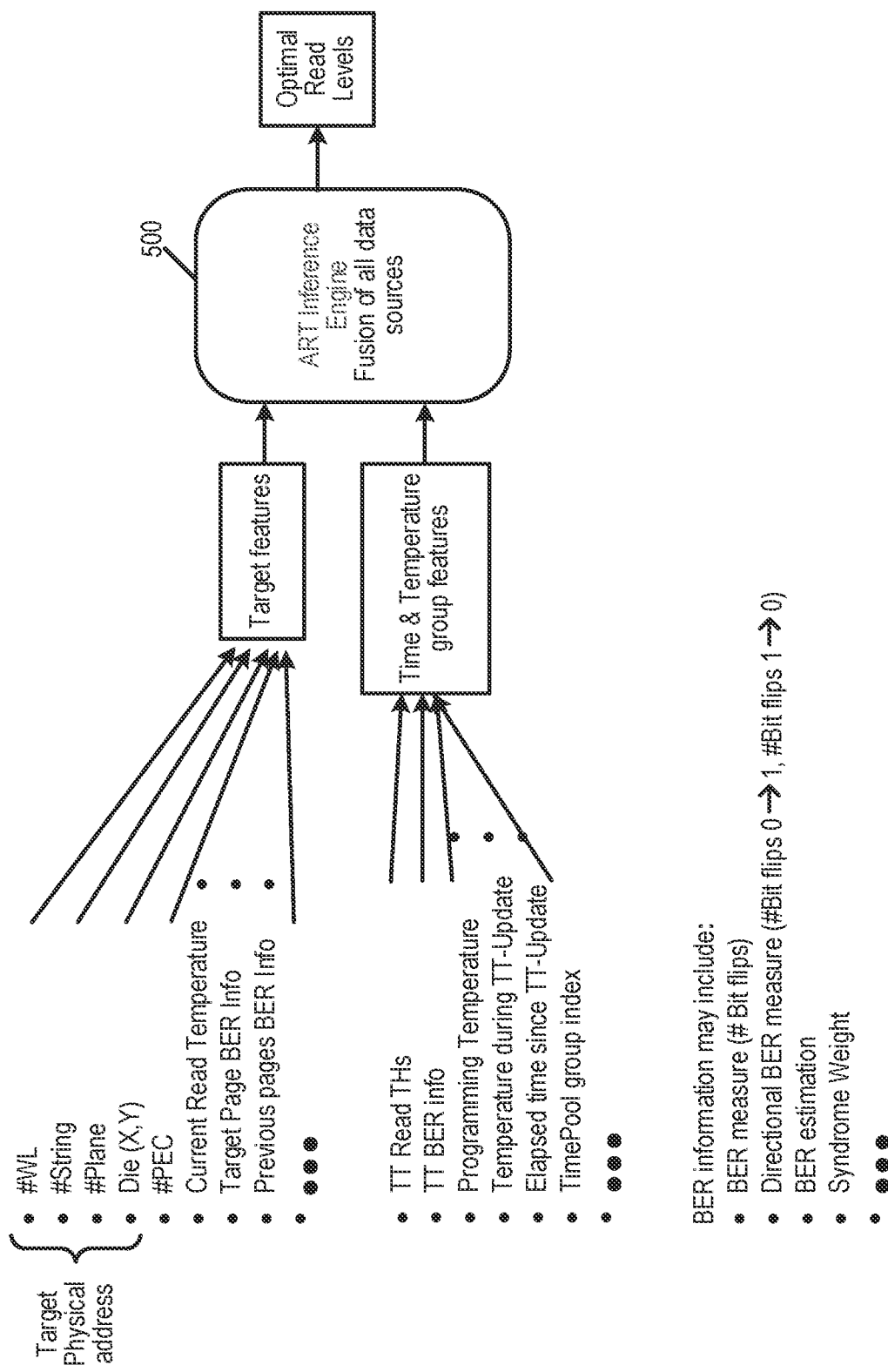
FIG. 5A is a diagram of an inference engine of an embodiment.

FIG. 5A is a diagram of an inference engine 500 of an embodiment that illustrates this approach. The model training can be done either offline or online, or in combination (e.g., basic offline training with online fine tuning and re-training). Regarding off-line training, one of the major problems of any machine learning project is obtaining a large labeled data set (i.e., obtaining "Big Data" to train a model). Fortunately, for the problem at hand, this task is fairly simple. A large amount of state-by-state cell-voltage-distribution ("SbS CVD") measurements can be obtained at different NAND conditions, and, based on those measurement, both the features (as listed above) and the optimal read thresholds for each measurement can be obtained that will serve as the label. Then, the machine-learning model can be trained to couple non-linearly between the input features (including the target page parameters and the TT group parameters) and the optimal read thresholds. During device regular operation, the machine-learning model can be applied at regular read operations or read-error-handling (REH) can be used. As demonstrated below, a compact and highly simple machine-learning model can provide significant reduction in the resulting failed bit count (FBC) comparing the default read thresholds. The relevant model parameters may be kept in ROM or SRAM or in the non-volatile memory 104 (e.g. in SLC blocks). However, very simple models, requiring very small RAM/ROM, can provide excellent results.

Figure 5B:
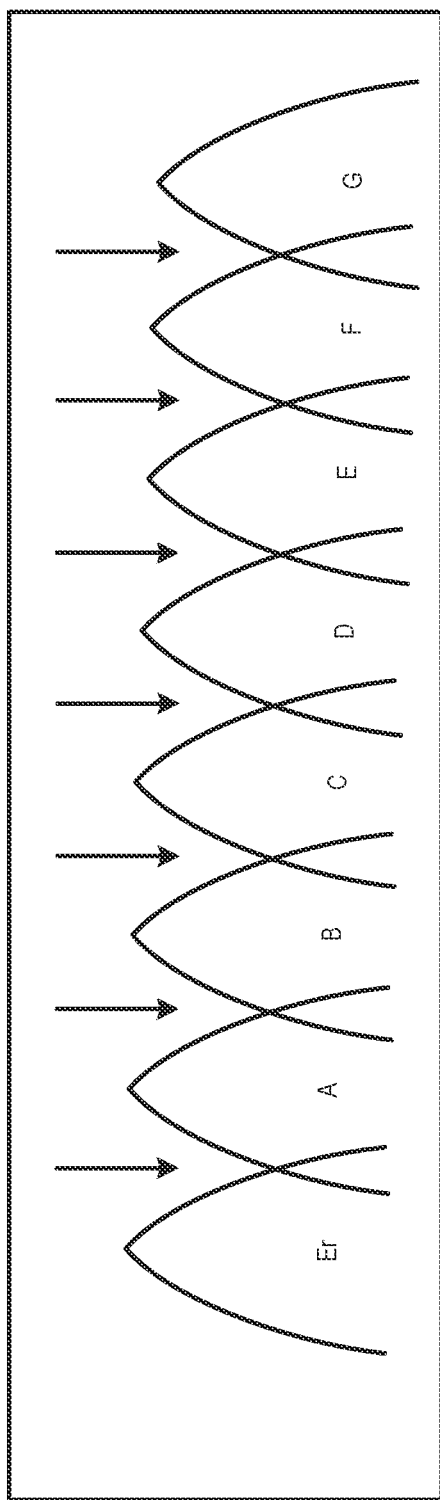
FIG. 5B is a graph of an embodiment from which read thresholds can be derived

For example, in performing data collection and building a training test, State-by-State Cell Voltage Distributions (SbS CVD) can be collected for various conditions (PEC, memory bake times, program/read temperatures, etc.). FIG. 5B is a graph showing a SbS CVD based on which optimal read thresholds and other relevant information (such as the BER information for any set of read thresholds (optimal/BES/VS/Default)) can be derived. From each SbS-CVD, the optimal read thresholds can be determined, as well as BER statistics when reading at any read level. This allows a training data set to be built. For example, for an arbitrary WLj in Block k, an optimal read level label can be associated with a number of features, including, but not limited to: BES/VS read levels on representative wordline/s taken from a block m with similar conditions (except potentially its read temperature to emulate TT management scheme used by the system), TT read thresholds acquiring temperature (=read temperature of block m), elapsed time since acquiring (=additional bake time of block m), Block k PEC, elapsed time normalized by temperature, read temperature of Block k, program temperature of Block k, and BER information of various pages (possibly including target page in WLj of block k, previous pages in block k, the selected representative pages in block m, . . . ), physical address of target WLj (possibly including the WL index j, the plane #, the string #, edge block indication, die X/Y information).

Regarding the on-line training approach, that approach can include continuous data collection during the device's lifetime (of similar SbS-CVD data or other available data), at which the machine-learning model can either be trained or modified based on this dynamic data base. On-line training may continue during the life of the device. and model tuning may be performed.

Figure 6:
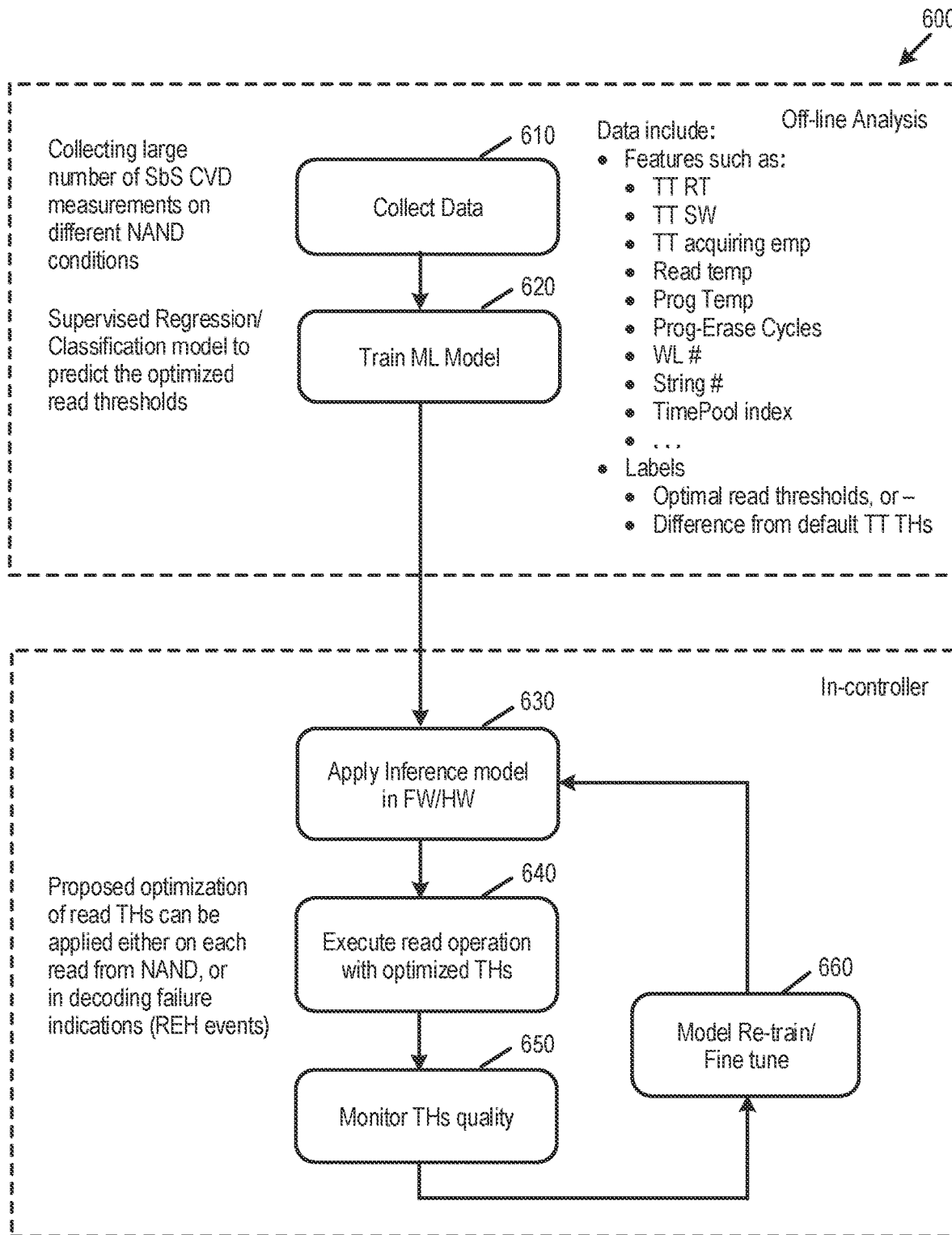
FIG. 6 is a flow chart of a method of an embodiment for inference of read thresholds based on memory parameters and conditions.

The approach in this embodiment can be much more agile and scalable, where additions and modifications of conditions are not required. This approach is illustrated in the flow chart 600 of FIG. 6. As shown in FIG. 6, first data is collected (act 610) and the machine-learning model is trained (act 620). These acts can be performed using an off-line analysis. Then, the controller 102 can apply an inference model (act 630), execute read operations within the optimized read thresholds (THs) (act 640), monitor the quality of the read thresholds (act 650), and retrain/fine-tune the model (act 660).

These embodiments can be generalized for optimization and inference of one or more of the following parameters based on the same or similar features that impact storage system's performance: read thresholds, program/verify thresholds, log-likelihood ratio (LLR) tables, soft-bit read thresholds or soft-bit delta values.

One embodiment is based on a hardware implementation of the inference engine, such that the inference is performed as part of the mainstream read operation from the host 300. In this case, the inference engine can have direct access to the memories that hold the features relevant for the current read operation (e.g., the TT tables, PEC table, temperature sensors, physical addresses, etc.). A low-level RISC can prepare a descriptor with the relevant features for the current read operation. In this way, the inference engine can provide optimized read levels for each read operation.

Figure 7:
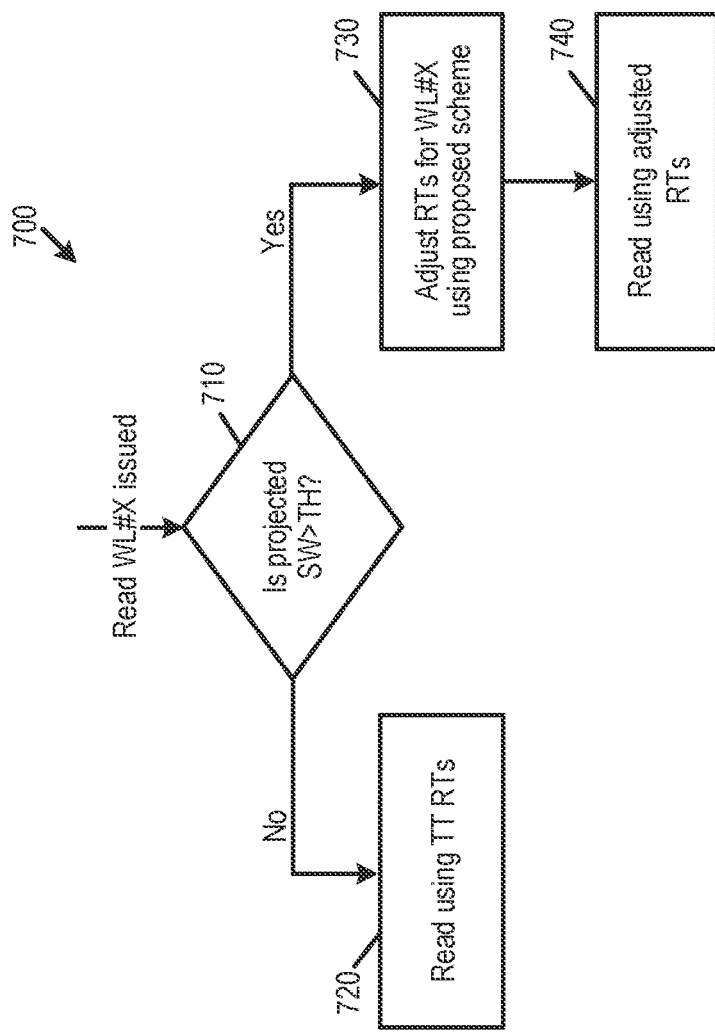
FIG. 7 is a flow chart of a selective usage method of an embodiment.

In another embodiment, if the inference is based on a firmware implementation or if the latency of accessing all the relevant features is prohibitive for a mainstream usage, selective usage of the inference engine may be applied. FIG. 7 is a flow chart 700 that illustrates selective usage. As shown in FIG. 7, when a read is issued, the controller 102 checks if the estimated BER (e.g. via ECC Syndrome Weight (SW) calculation) is greater than the threshold (act 710), which is indicative of whether the conditions in which the TT read threshold was acquired are similar to the current ones. If the SW is not greater than the threshold, the current read thresholds are used to read (act 720). However, if the SW is greater than the threshold, the read thresholds are adjusted (act 730) and are used to read (act 740).

Figure 8:
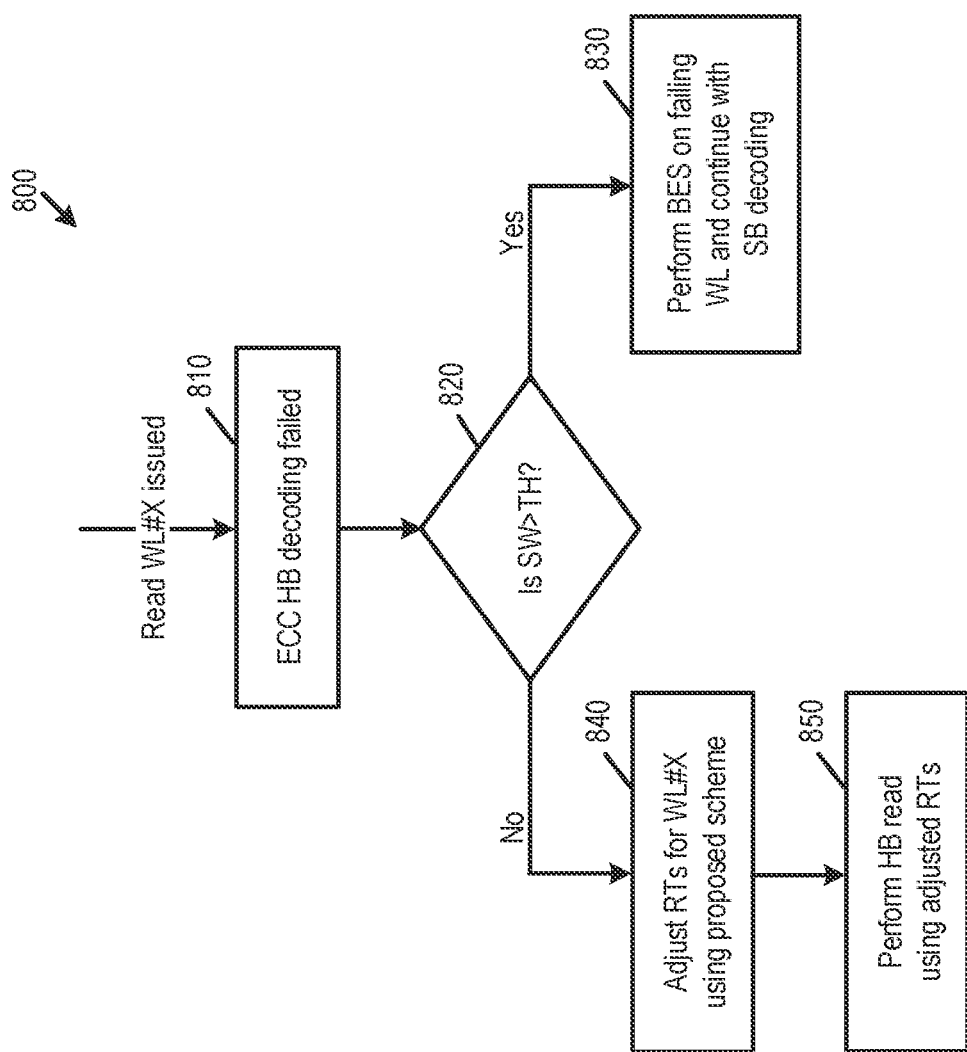
FIG. 8 is a flow chart of a method of an embodiment used as part of a read error handling flow.

In another alternative, these embodiments can be used as part of a Read Error Handling (REH) flow. For example, if the decoder has failed to decode after regular hard bit (HB) read, the read threshold inference module can be applied on the failing wordline, followed by another HB read. The conventional REH flow performs a lengthy read thresholds calibration operation (e.g., via BES or VS) directly after the HB decoding failure, and the proposed extra step may reduce the overall read latency significantly. This alternative is shown in the flow chart 800 in FIG. 8. As shown in FIG. 8, in this embodiment, after a read command is issued for a wordline, the controller 102 detects an ECC HB decoding failure (act 810) and determines whether the SW is greater than the read threshold (act 820). If it is, BES/VS is performed on the failing wordline (act 830). If it is not, the read threshold for the wordline is adjusted based on the inference function/engine (act 840) and an HB read is performed using the adjusted read threshold (act 850).

Figure 9:
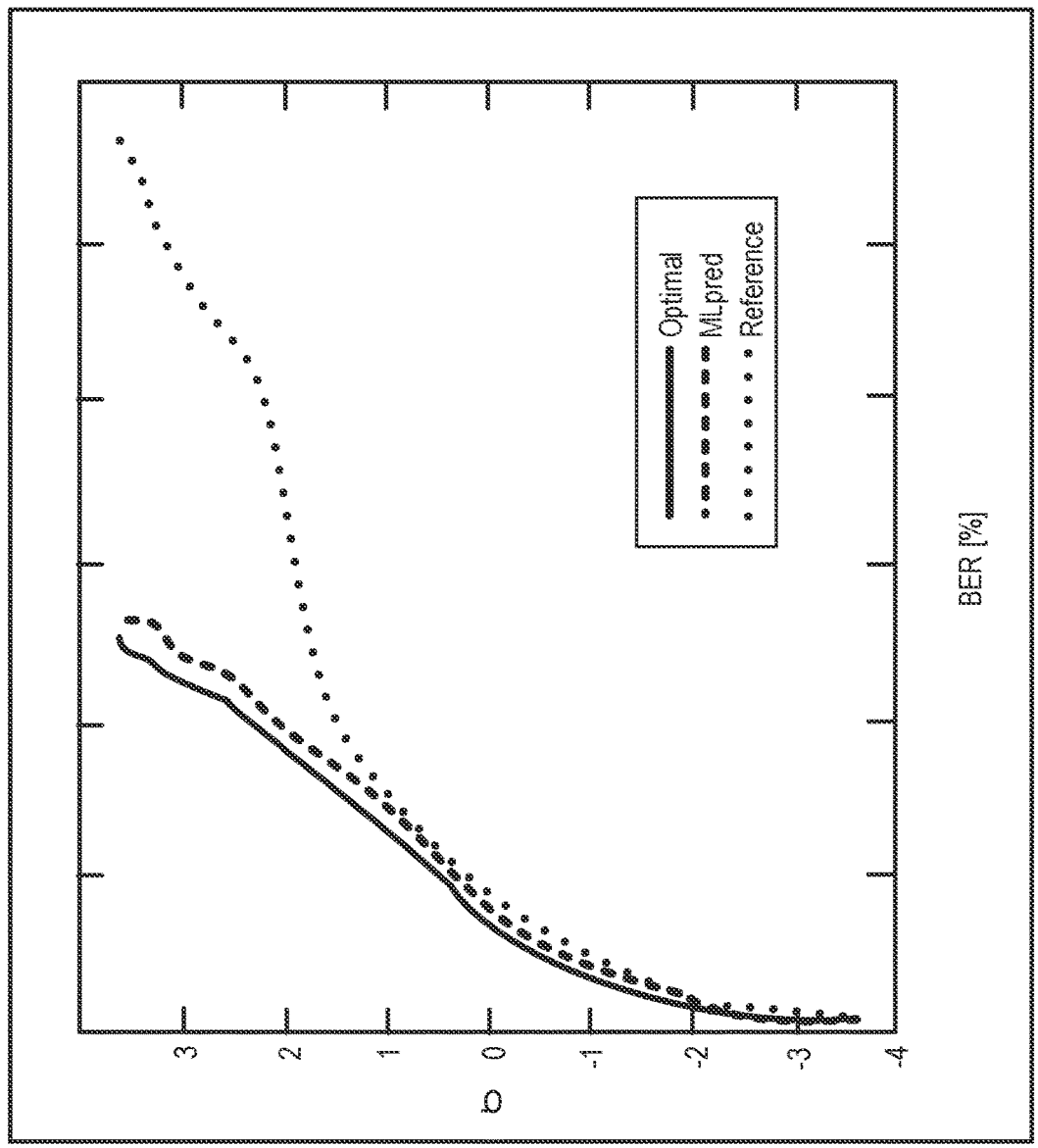
FIG. 9 is a graph of logical page results of an embodiment.

FIG. 9 is a Sigma-Plot graph for FBC measured over different test conditions. The three curves represents a reference, the optimal read threshold, and results generated using a machine-learning-based inference engine. The results show significant gain when using the machine-learning-based inference engine as compared to the reference. Large gains are especially observed for samples where the TT read threshold acquiring temperature is different than current read temperature. In that situation, the TT read threshold becomes significantly sub-optimal while the machine-learning-based inference engine provides effective compensation for the temperature difference. It should be understood that this information is being provided for illustration purposes and is not intended as a limitation, in any way, on the claims.

There are several advantages associated with these embodiments. For example, using a machine-learning-based approach can provide significant improvement in read threshold accuracy versus a reference method, as shown above. The improved read thresholds result in reduced BER, which can improve NAND latency and throughput, improve power consumption, reduce error rates, and improve quality of service.

Another embodiment relates to a fast hardware implementation of symmetric tree models for read threshold calibration, in which a low-complexity system and method are provided for inferring optimal read thresholds (RTs) from all available information, including time and temperature (TT) group information, temperature information, BER information, PEC information, and physical page location. In one example implementation, read thresholds or other values are inferred in a fast manner using a low application-specific integrated circuit (ASIC) footprint and low-power consumption.

As mentioned above, a problem with some approaches to determining a read threshold is that the data is not fitted to a specific set of parameters and is rather grouped over similar conditions, which can provide sub-optimal (but reasonable) results. In theory, it would be possible to run a direct calculation of the read thresholds for every read flash management unit (FMU), yielding near optimal results. However, as the duration of performing read threshold calibration on the physical storage is very long, such a method may not be able to reach satisfactory performance and, therefore, is impractical. For example, covering all sets of conditions in a direct manner of storing informative data tables for all relevant cases can result in an impractical data table size that would be very expensive to hold and manage.

In some of the embodiments described above, machine-learning ("ML") based methodologies were applied in the controller 102 for inference of optimal read thresholds based on various memory parameters. In the embodiment discussed below, a low-complexity inference engine is used for very fast and accurate acquisition of read thresholds. In one example implementation, a binary tree model is used to efficiently store only a subset of relevant correction data with a minimal footprint. The embodiment does not need to directly approach the memory 104 in order to generate threshold calibrations, hence, can be much faster than BES\VS-based calibrations. Moreover, the unique structure of the binary tree allows for a fast and low-area and low-power solution, as discussed below.

In general, with this embodiment, the controller 102 infers optimal read thresholds based on a non-linear function of multiple inputs that reflect current memory and data conditions. This method can be implemented in hardware in the controller 102 and use symmetric binary trees and a single step (parallelizable) tree traverse method to ensure fast inference and a low-power design. This can allow for a continuous read threshold inference, reducing the BER levels of read data, which can improve performance and quality of service, reduce power consumption, and reduce correctable error correction code (CECC) rates. Unlike implementations that can use complicated and expensive hardware that require a very long processing duration (due to lack of parallel computations of trees), these embodiments can provide an ultra-fast computation of a tree-based read threshold inference method with a minimal hardware footprint. This can be achieved by presenting two main enablers, each contributing to the reductions of size and latency of the model: binary full-depth symmetrically-sorted trees and multi-output models.

Figure 10:
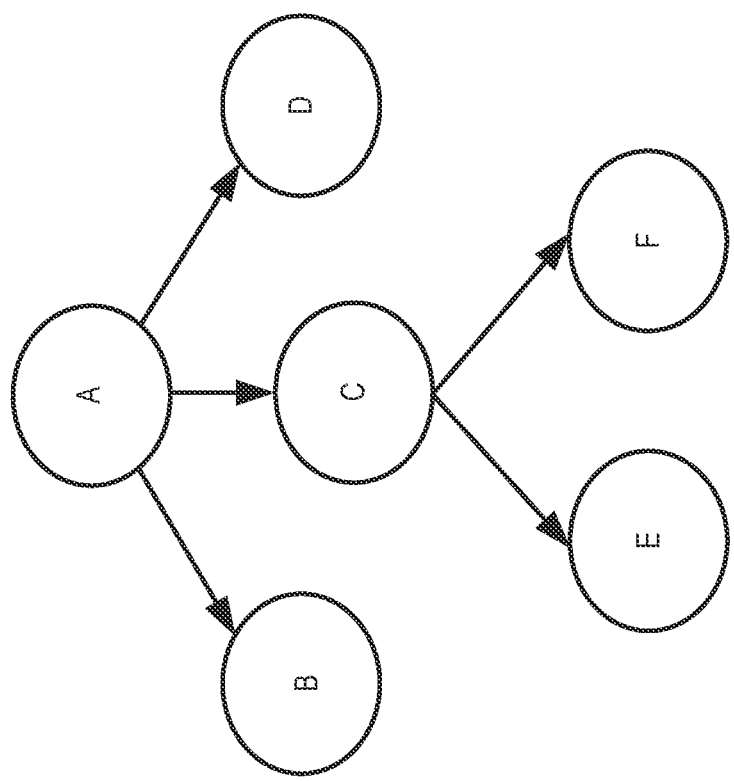
FIG. 10 is a diagram of a tree data structure of an embodiment.

Turning first to binary full-depth symmetrically-sorted trees, trees are a general hierarchical data structure, staring from a top node that is connected to lower nodes (children), where each child has a single parent, and each node optionally having children of its own, thus exponential growing the size of the data structure. For ease-of-use, trees are often kept in a sorted manner. Trees have many benefits among which is logarithmic run time for many operations. FIG. 10 is a diagram of a tree data structure of an embodiment.

Figure 11:
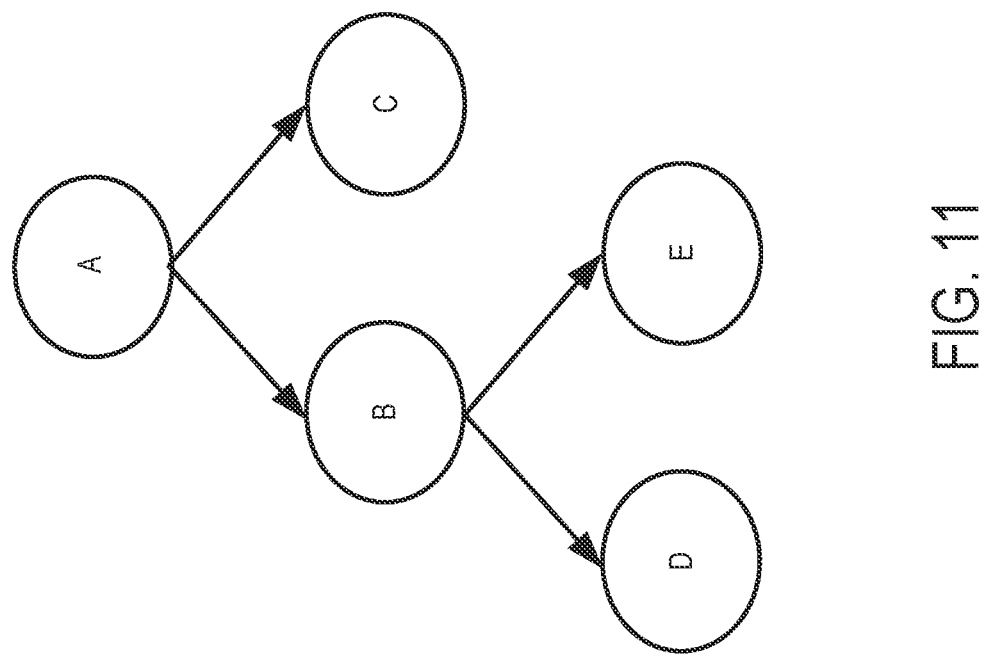
FIG. 11 is an example of a binary tree data structure of an embodiment.
Figure 12:
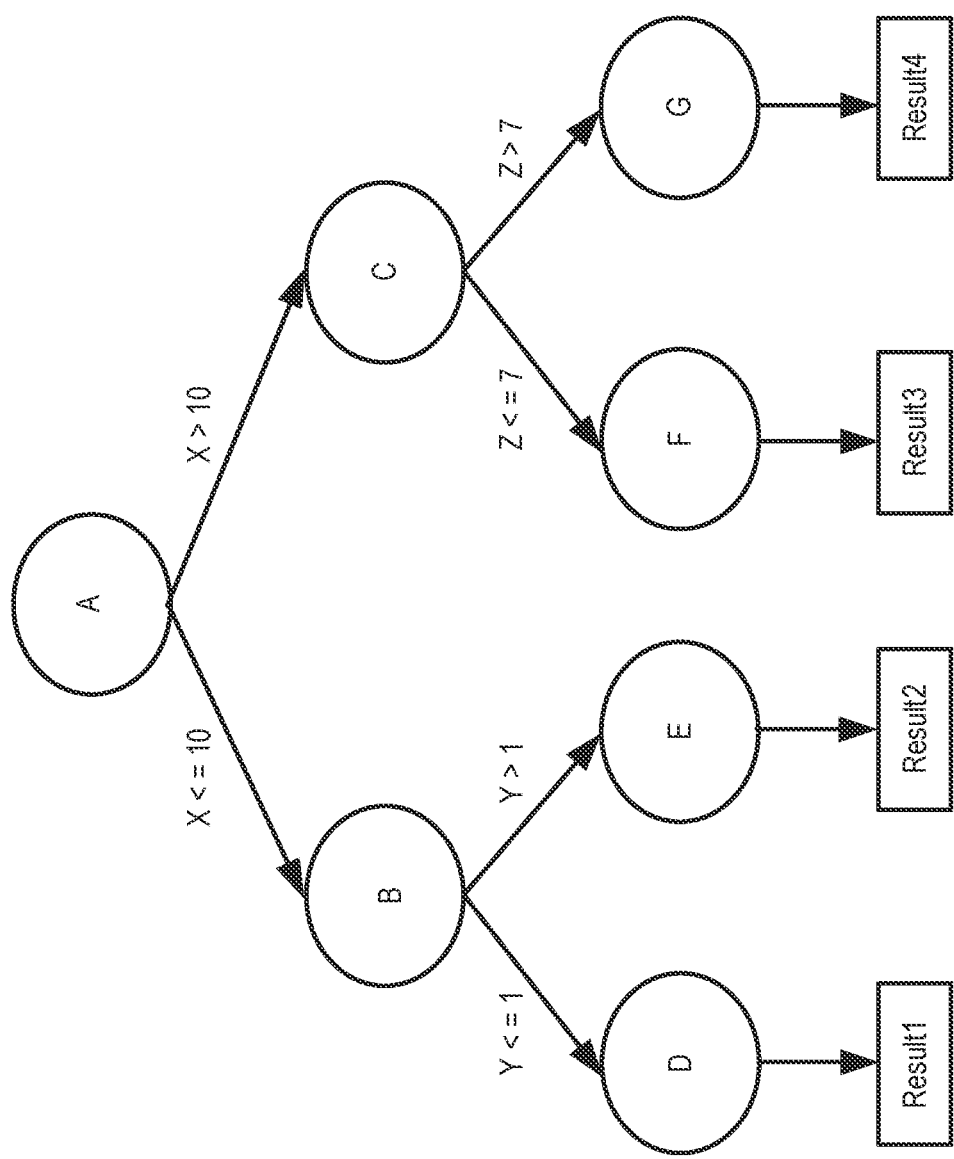
FIG. 12 is an example of a binary full-depth tree data structure of an embodiment.

A commonly-used type of tree is a binary tree. In a binary tree, each parent may have only two children (a left and right node); hence, the split between the two nodes can be represented by a single Boolean value (a single "if" statement (e.g., if X>Y choose the left node; otherwise, choose the right node). FIG. 11 is an example of a binary tree data structure of an embodiment. As shown in this drawing, a tree may have different depths for different nodes. "Internal" nodes are ones with children, while "external" nodes (or "leaves") are ones without children. Staring from root "A", the left internal node "B" has another hierarchy below it; hence, the depth of its path would be two. In contract, node "C" on the right is an external node; hence, the depth would be one. For a full-depth binary tree, all the paths are limited to be of the same depth. In other words, all the tiers except the last should have two children, as shown in FIG. 12.

When addressing trees in a machine-learning model, each node represents a split. The taken path is decided by a binary question regarding one or more of the model parameters (i.e., by comparing the model parameter to a given threshold). For example, for node A in FIG. 12, if parameter X>10, the right path is taken; otherwise, the left path is taken. Thus, it is possible to traverse down the tree until an external node ("leaf") is reached, where each external node would represent an output value for the machine-learning model.

Figure 13:
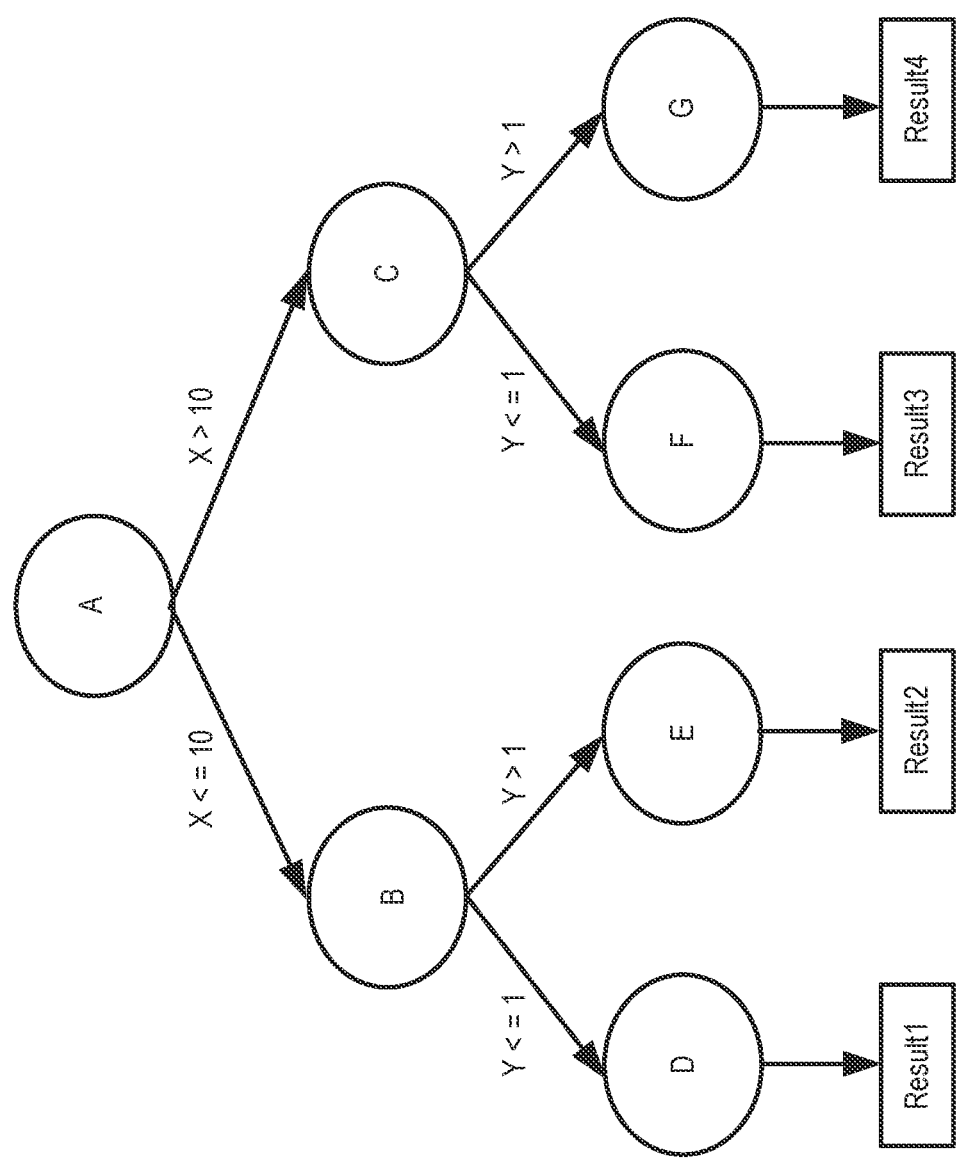
FIG. 13 is an example of a binary full-depth symmetrically-sorted tree data structure of an embodiment.

Binary full-depth symmetrically-sorted trees would have the same condition for all the nodes in the same hierarchy as depicted by FIG. 13. Note that the splits from nodes B and C have the same conditions about whether parameter Y>1. Despite the fact that having the same question for all the hierarchy seems somewhat limiting, it proves to be highly beneficial. First, it still provides sufficient flexibility for obtaining rich machine-learning models that achieve excellent performance (i.e., minimal inference error). Second, as for a given hierarchy of the tree (i.e., for a given depth), the same binary question determines the results of all the splits in that hierarchy regardless of the results of the previous hierarchy. This allows for parallel computation of all the d binary questions (=threshold comparisons, =if conditions) of all the d hierarchies of the tree without the need to sequentially traverse the tree from the root to the leaves in d sequential computation steps. In addition, to obtain rich machine-learning models, multiple trees ("forests") can be used, and all trees in the forest can be operated in parallel in a single step.

If a conventional (non-symmetric) binary tree is used, the penalty would either be to traverse the tree in O(d=tree_depth) steps or pre-calculate in a single step all the possible paths and then choose the correct one, which would increase the corresponding hardware by an exponential factor of $2^{tree\_depth}$. Hence, this solution of this embodiment is both rapid and minimizes the ASIC area and power.

Figure 14:
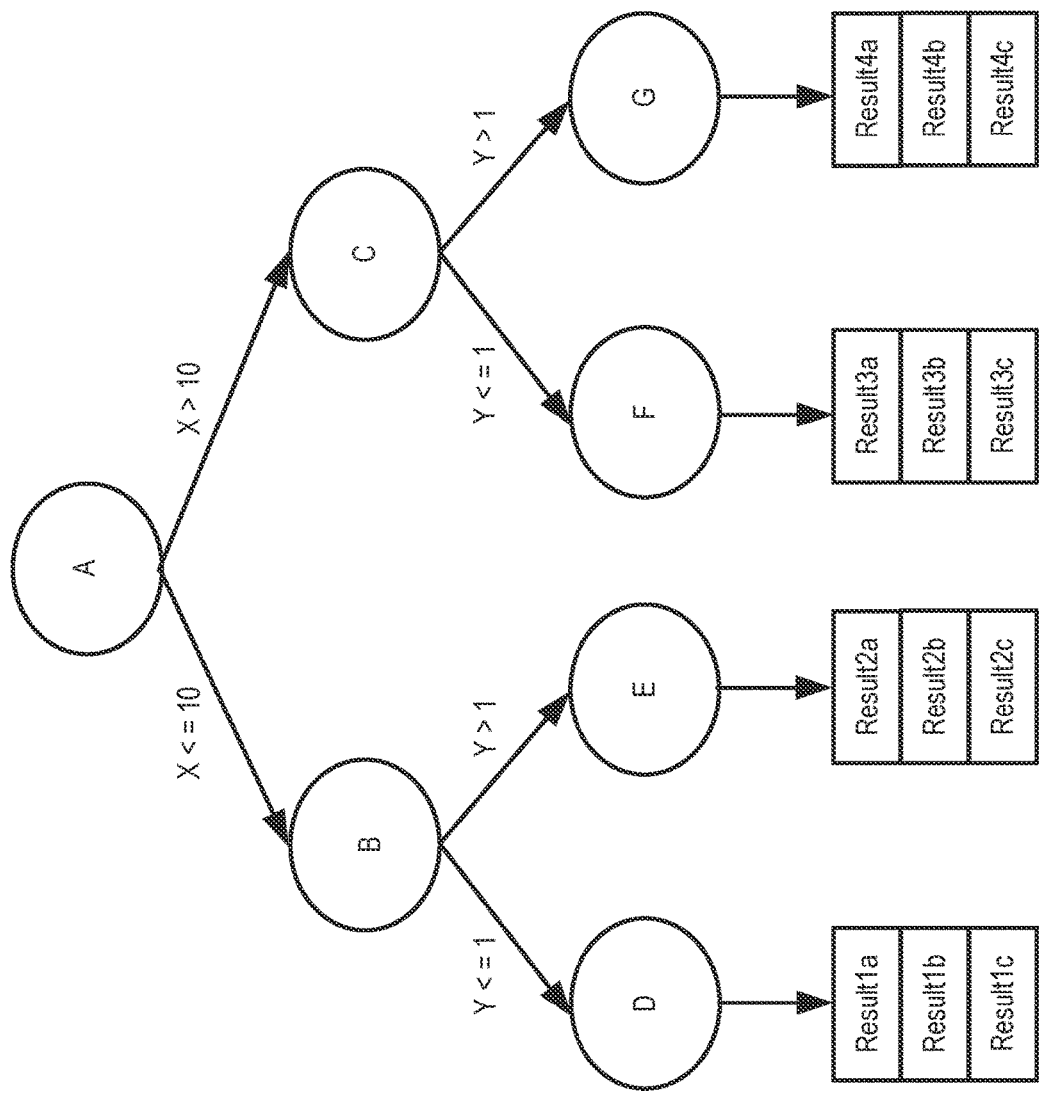
FIG. 14 is an example of a binary full-depth symmetrically-sorted tree data structure of an embodiment with multiple outputs.

As mentioned above, another factor uses with this embodiment is a multi-output model. A multi-output machine-learning model is a model that outputs several results at the same time, or, in the case of a tree, each external node (leaf) would be associated with several values, as shown in FIG. 14. In general, outputting more than a single parameter is easy and can be achieved by coupling several models having the same inputs, and different outputs when trained together will yield a large model encapsulating all previous models. However, when these several models have inherent similarities, joining them during the training will yield a compact model as similarities in the models save space and time.

A multi-output machine-learning model is a model that outputs several results at the same time. In the case of a tree, each external node (=leaf) would be associated with several values. In the case of read thresholds, since all tend to behave similarly, holding a single multi-output model instead of 7 models for TLC and 15 models for QLC instantly reduces the model size by almost the full factor (i.e., 7 or 15), which in turn minimizes the ASIC area and power.

Figure 15:
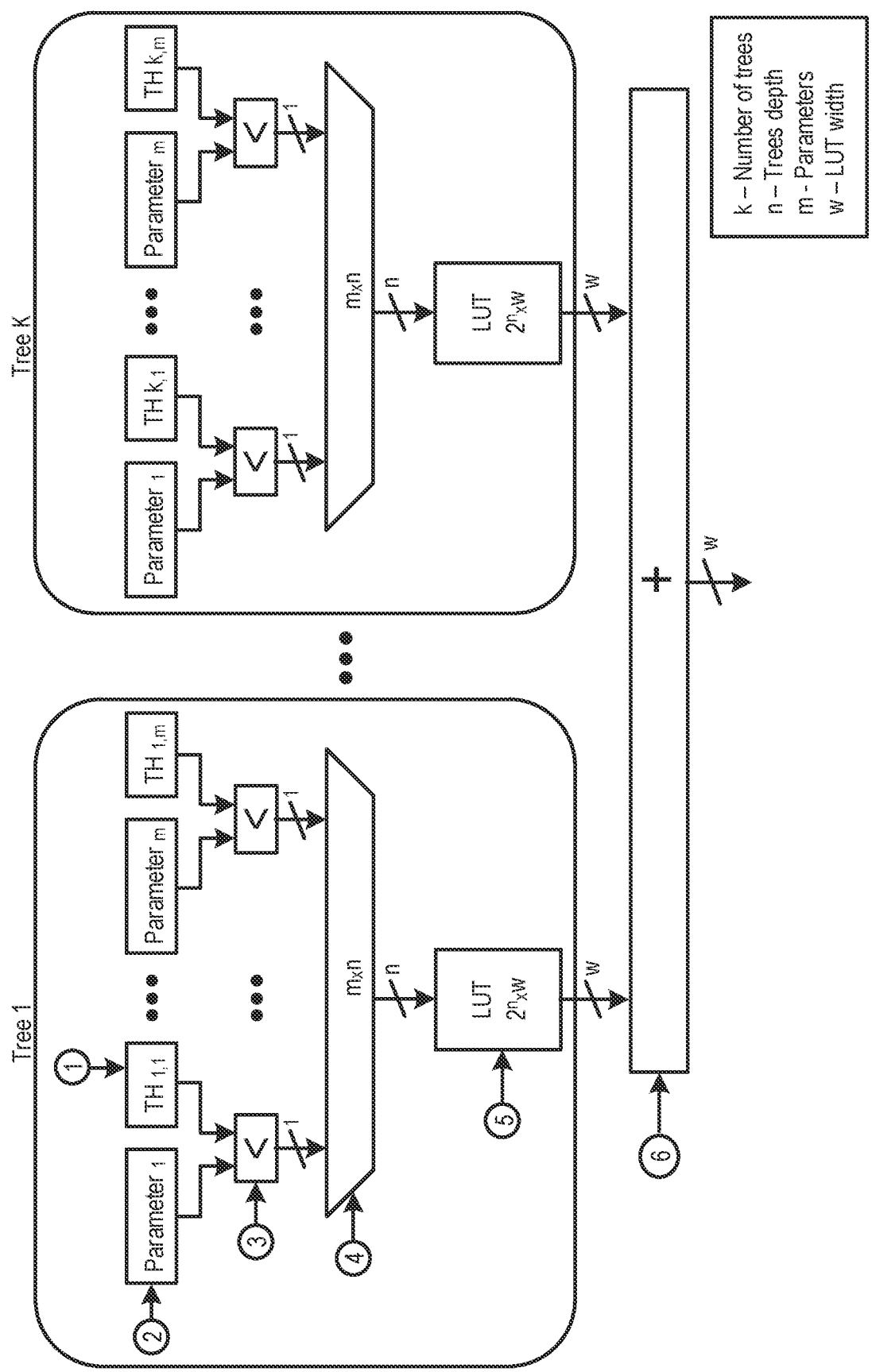
FIG. 15 is an example of a binary full-depth symmetrically-sorted tree data structure of an embodiment.
Figure 16:
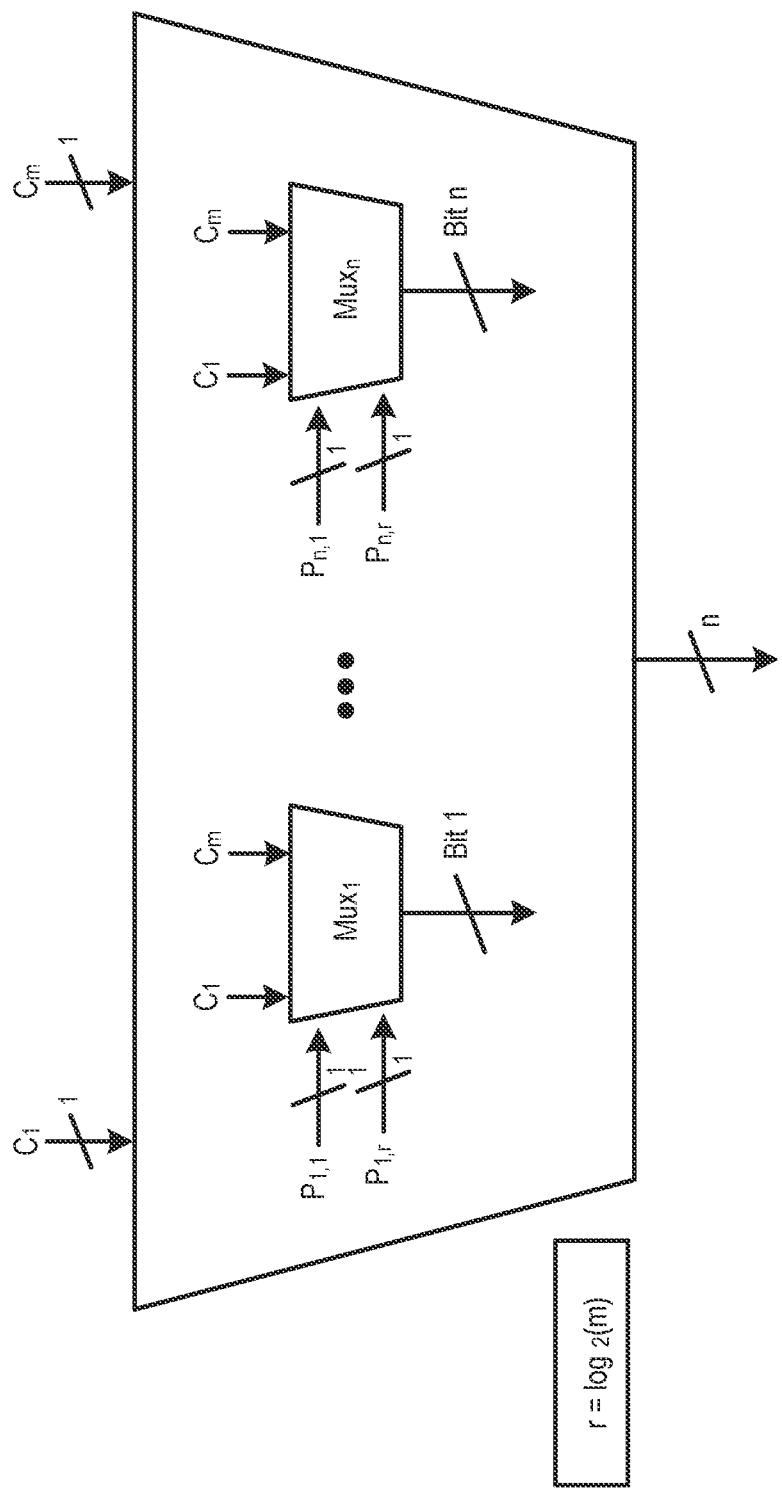
FIG. 16 is a diagram of a multiplexor of an embodiment.

Given the above theoretical analysis, one embodiment provides an optimized method to implement such a tree-based model. In one implementation, a forest approach is used where more than one tree is used, and tree results are accumulated in a boosting approach, as shown in FIG. 15 (FIG. 16 is detailed diagram of the multiplexor 4 shown in FIG. 15). In these drawings, k is in the number of trees in the forest. n is the depth (equal to all trees and paths), m is the number of parameters, and w is the width of the look-up table (LUT). For example, a realistic system may have k=32 trees, n=5, m=30, and w=7B for TLC and 15B for QLC. This yields the following RAM footprint:

$$k*2^n*w=32*2^5*7=7168 Bytes$$

As shown in FIG. 15, the six main components can be used in parallel and without complicated logic:

1. Thresholds—For each Tree, a set of m thresholds are obtained from training and fed to a dedicated memory (k*m).
2. Parameters—The m parameters representing the current features are fed to all the trees. These values can be updated before every inference cycle.
3. Comparators—A set of m comparators is used per tree to compare each of the m parameters to the m thresholds, outputting a single-bit result.
4. Multiplexor (Mux)—A set of n multiplexors of m-to-1 is used per tree. Each Mux selects the appropriate parameter query (out of m) that is used in the specific tree hierarchy (out of n), such that, in total, n bits are output from each tree mux block indicating the selected leaf (out of the $2^n$ leaves of the tree).
5. Look-Up Table (LUT)—The n-bit values per tree are used to index depth $2^n$ LUTs per tree, storing the w read threshold values (or read threshold correction values) for each leaf of the tree. The w read thresholds (or read threshold correction terms) are output per tree.
6. Accumulator—The k sets of read threshold values (or read threshold correction values) are accumulated (per threshold) over all the trees and output a total correction term.

In some implementations, a seventh step can be used to add a bias term and multiply by a factor.

In another embodiment, a two-step inference process is used. More specifically, some systems may have features that are dynamic, changing for each inference cycle, and some that are semi-static, which tend to stay the same for a long period before changing. For example, in TT thresholds calibration, the current wordline, string, place, PEC count, and read temperature may change for each inference case. However, for TT read threshold BER on a TT representative, the temperature at the time of TT update may remain the same for a very long time.

Figure 17:
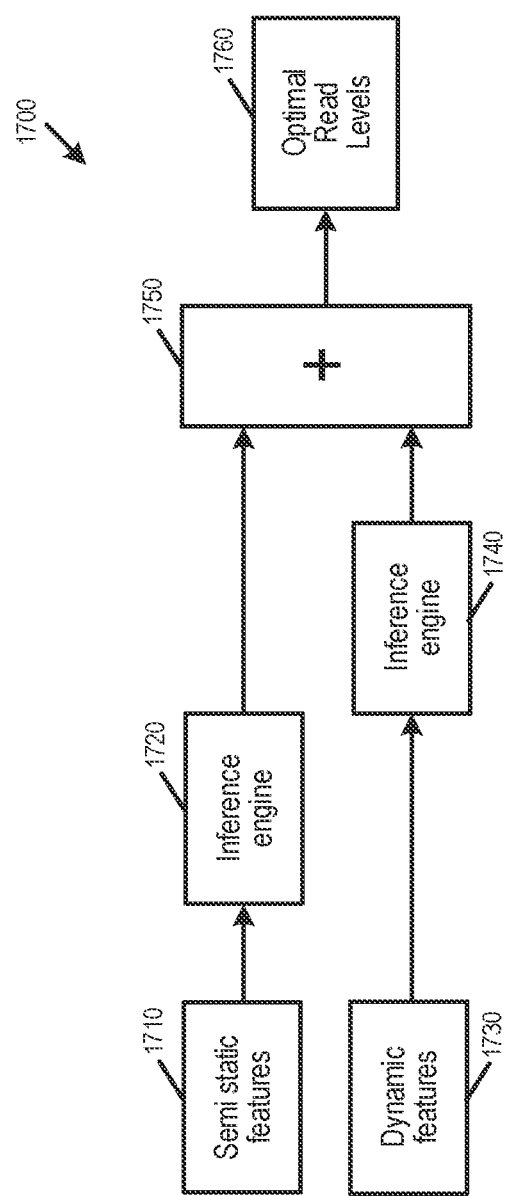
FIG. 17 is a block diagram of a system of an embodiment having separate inference engines for dynamic and semi-static features.

Therefore, a model can be built such that a part of it only uses the semi-static features (e.g., half of the trees), and another part of it is trained in an additive or incremental manner and will only use the dynamic features. Such an approach 1700 is depicted in FIG. 17. As shown in FIG. 17, the embodiment comprises a semi-static features 1710 input to a first interference engine 1720, and dynamic features 1730 input to a second interference engine 1740. The outputs of the first and second interference engines 1720, 1730 are provided to an adder 1750 that outputs the optimal read levels 1760. The first and/or second interference engines 1720, 1730 can be implemented as described above. Using this method, the semi-static inference can be done seldomly (e.g., once every TT update) and saved aside for later. The dynamic inference component can be operated repeatedly on different cases and joined to corresponding existing semi-static inferences. In the case of TT, the system can save a semi-static inference result per TT or group of TTs. By separating the inference to two phases, the same inference engine can be used for both tasks, and the size of the inference engine can be reduced, as it will work with two small models instead of a single large one, thus further saving area and power.

In summary, this embodiment can generate improved read thresholds, resulting in reduced BER, which can improve memory latency, throughput, and power consumption; reduce CECC rates; and improve quality of service in hardware, which is advantageous for real-time operations on every read. Also, by running with a low-memory footprint, the embodiment can be much faster than other designs, while provide a reduced area and power footprint.

Finally, as mentioned above, any suitable type of memory can be used. Semiconductor memory devices include volatile memory devices, such as dynamic random access memory ("DRAM") or static random access memory ("SRAM") devices, non-volatile memory devices, such as ReRAM, electrically erasable programmable read only memory ("EEPROM"), flash memory (which can also be considered a subset of EEPROM), ferroelectric random access memory ("FRAM"), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two-dimensional (2D) memory structure or a three-dimensional (3D) memory structure.

In a 2D memory structure, the semiconductor memory elements are arranged in a single plane or a single memory device level. Typically, in a 2D memory structure, memory elements are arranged in a plane (e.g., in an x-z direction plane) that extends substantially parallel to a major surface of a substrate that supports the memory elements.

The substrate may be a wafer over or in which the layer of the memory elements is formed or it may be a carrier substrate that is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A 3D memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements in each column. The columns may be arranged in a 2D configuration, e.g., in an x-z plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the 2D and 3D structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, which are intended to define the scope of the claimed invention. Finally, it should be noted that any aspect of any of the embodiments described herein can be used alone or in combination with one another.

What is claimed is:
1. A storage system comprising:
a memory; and
a processor coupled with the memory and configured to:
input a plurality of parameters of the memory into a binary full-depth symmetrically-sorted tree, wherein:
the tree is binary in that each node of the tree either has only two child nodes or no child nodes, an internal node is a node with two child nodes, and an external node is a node with no child nodes;
the tree is full-depth in that all paths from each internal node in a given tier of the tree have a same number of nodes; and
the tree is symmetrically-sorted in that splits from each internal node to child nodes in a same tier of the tree are based on a comparison of a same one of the plurality of parameters of the memory with a same condition, wherein different tiers of the tree compare different respective ones of the plurality of parameters of the memory with different respective conditions;
perform parallel comparisons of the different respective ones of the plurality of parameters of the memory with the different respective conditions associated with each tier of the tree, wherein a comparison performed at a given tier of the tree is independent of a comparison performed at another tier of the tree;

select a read threshold from one of the external nodes of the tree, wherein each external node of the tree comprises at least one read threshold generated from performing the parallel comparisons; and use the selected read threshold to read a wordline in the memory.

2. The storage system of claim 1, wherein each external node outputs a plurality of read thresholds.

3. The storage system of claim 1, wherein the processor is further configured to use at least one additional binary full-depth symmetrically-sorted tree in parallel with the tree, and wherein the read threshold is selected from one of the external nodes of the tree and the at least one additional tree.

4. The storage system of claim 1, wherein the processor comprises:
a plurality of comparators;
a multiplexor; and
a look-up table.

5. The storage system of claim 4, wherein the processor further comprises:
an accumulator.

6. The storage system of claim 4, wherein the processor is further configured to a bias the selected read threshold.

7. The storage system of claim 1, wherein the processor is further configured to use a two-step inference process, wherein one step is used for a semi-static memory parameter and another step is used for a dynamic memory parameter.

8. The storage system of claim 1, wherein the parameters of the memory comprise one or more of the following: time and temperature group information, temperature information, bit error rate (BER) information, program-erase count (PEC) information, and physical page location information.

9. The storage system of claim 1, wherein the processor comprises an inference engine implemented at least partially in hardware.

10. The storage system of claim 1, wherein the memory comprises a three-dimensional memory.

11. In a storage system comprising a memory, a method comprising:
inputting a plurality of parameters of the memory into a binary full-depth symmetrically-sorted tree, wherein:
the tree is binary in that each node of the tree either has only two child nodes or no child nodes, an internal node is a node with two child nodes, and an external node is a node with no child nodes;
the tree is full-depth in that all paths from each internal node in a given tier of the tree have a same number of nodes; and
the tree is symmetrically-sorted in that splits from each internal node to child nodes in a same tier of the tree are based on a comparison of a same one of the plurality of parameters of the memory with a same condition, wherein different tiers of the tree compare different respective ones of the plurality of parameters of the memory with different respective conditions;
performing parallel comparisons of the different respective ones of the plurality of parameters of the memory with the different respective conditions associated with each tier of the tree, wherein a comparison performed at a given tier of the tree is independent of a comparison performed at another tier of the tree;
selecting a read threshold from one of the external nodes of the tree, wherein each external node of the tree comprises at least one read threshold generated from performing the parallel comparisons; and
using the selected read threshold to read a wordline in the memory.

12. The method of claim 11, wherein each external node outputs a plurality of read thresholds.

13. The method of claim 11, further comprising:
using at least one additional binary full-depth symmetrically-sorted tree in parallel with the tree, and wherein the read threshold is selected from one of the external nodes of the tree and the at least one additional tree.

14. The method of claim 11, further comprising:
comparing the plurality of parameters of the memory with a plurality of thresholds from a training model;
based on a selected one of the plurality of parameters, outputting an indication of a leaf of the tree; and
providing the read threshold associated with the indicated leaf of the tree.

15. The method of claim 14, further comprising:
accumulating the selected read threshold along with at least one additional read threshold generated from at least one additional binary full-depth symmetrically-sorted tree.

16. The method of claim 14, further comprising biasing the selected read threshold.

17. The method of claim 11, further comprising using a two-step inference process, wherein one step is used for a semi-static memory parameter and another step is used for a dynamic memory parameter.

18. The method of claim 11, wherein the parameters of the memory comprise one or more of the following: time and temperature group information, temperature information, bit error rate (BER) information, program-erase count (PEC) information, and physical page location information.

19. The method of claim 11, wherein the method is performed at least partially in hardware.

20. A storage system comprising:
a memory; and
means for:
inputting a plurality of parameters of the memory into a binary full-depth symmetrically-sorted tree, wherein:
the tree is binary in that each node of the tree either has only two child nodes or no child nodes, an internal node is a node with two child nodes, and an external node is a node with no child nodes;
the tree is full-depth in that all paths from each internal node in a given tier of the tree have a same number of nodes; and
the tree is symmetrically-sorted in that splits from each internal node to child nodes in a same tier of the tree are based on a comparison of a same one of the plurality of parameters of the memory with a same condition, wherein different tiers of the tree compare different respective ones of the plurality of parameters of the memory with different respective conditions;
performing parallel comparisons of the different respective ones of the plurality of parameters of the memory with the different respective conditions associated with each tier of the tree, wherein a comparison performed at a given tier of the tree is independent of a comparison performed at another tier of the tree;
selecting a read threshold from one of the external nodes of the tree, wherein each external node of the tree comprises at least one read threshold generated from performing the parallel comparisons; and using the selected read threshold to read a wordline in the memory.

* * * * *